United States Patent
Katz et al.

(10) Patent No.: US 11,197,386 B2
(45) Date of Patent: Dec. 7, 2021

(54) REMOVABLE I/O MODULE WITH DIAGNOSTICS FOR A FIELD DEVICE I/O CONNECTOR

(71) Applicant: Phoenix Contact Development and Manufacturing, Inc., Middletown, PA (US)

(72) Inventors: David Nathan Katz, Hummelstown, PA (US); Davis Mathews, Lewisberry, PA (US); Jason Alan Norris, Stow, OH (US); Brian John Gillespie, Hummelstown, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 48 days.

(21) Appl. No.: 16/710,767

(22) Filed: Dec. 11, 2019

(65) Prior Publication Data

US 2021/0185846 A1    Jun. 17, 2021

(51) Int. Cl.
*H05K 7/00* (2006.01)
*H05K 7/14* (2006.01)
*G01R 1/20* (2006.01)

(52) U.S. Cl.
CPC .......... *H05K 7/1468* (2013.01); *G01R 1/206* (2013.01); *H05K 7/1478* (2013.01); *H01R 2201/04* (2013.01)

(58) Field of Classification Search
CPC combination set(s) only.
See application file for complete search history.

(56) References Cited

U.S. PATENT DOCUMENTS

| 6,175,932 B1* | 1/2001 | Foote .................... G06F 13/409 710/10 |
| 9,971,727 B2 | 5/2018 | Brodbeck et al. |
| 10,083,143 B2 | 9/2018 | Tanimura et al. |
| 2007/0243830 A1 | 10/2007 | Isenmann et al. |
| 2010/0077111 A1 | 3/2010 | Holmes et al. |
| 2020/0272119 A1* | 8/2020 | Mielnik .................... H05K 1/18 |
| 2020/0396857 A1* | 12/2020 | Chakraborty .......... H01R 9/245 |

FOREIGN PATENT DOCUMENTS

WO    200409889 A1    11/2004

OTHER PUBLICATIONS

European Patent Office, International Search Report in corresponding PCT/US2020/052087, dated Dec. 10, 2020, 14 pages.

* cited by examiner

*Primary Examiner* — Hung S. Bui
(74) *Attorney, Agent, or Firm* — Hooker & Habib, P.C.

(57) ABSTRACT

A field device I/O connector includes a base and an I/O module removably mounted on the base for transmitting I/O signals along an I/O channel. A set of electrical connectors mounted on the base connect the base to a field device. The electrical connectors, the base, and the I/O module mounted on the base cooperate to define the I/O channel. The I/O channel includes a conversion circuit to convert between I/O signals and a digital data format output from the field device I/O connector. The base and I/O module also cooperate to define a diagnostic circuit connected to the portion of the I/O channel extending through the I/O module. The diagnostic circuit extends to a diagnostic logic circuit that may be included on the base, in the I/O module, or away from the field device I/O connector.

16 Claims, 3 Drawing Sheets

REMOVABLE I/O MODULE WITH DIAGNOSTICS FOR A FIELD DEVICE I/O CONNECTOR

BACKGROUND OF THE DISCLOSURE

Process control networks transmit I/O signals to and from field devices under the control of a control system that regulates and controls industrial processes. Field devices include sensors and actuators. Sensors transmit input signals representing the state of process variables to the controllers, and actuators receive output signals from the controllers and take action to affect process variables.

I/O signals may be analog signals or digital signals. Analog I/O signals are variable, in which a voltage or current represents the magnitude of a process parameter such as flow rate or the desired position of a valve. Digital I/O signals represent one of two states: "on/off", "opened/closed", and the like.

Digital signals used in process control are also used to actuate a relay or to count pulses.

Sophisticated industrial processes may use a number of field devices distributed over a wide area for process control. I/O field wiring from the field devices is often brought to a central location for ease of management. The field wiring may extend to sets of terminals of a terminal block contained in a wiring cabinet. A circuit (referred to as an I/O channel herein) includes the set of terminals and includes a conversion circuit that ultimately is connected to the control system. The conversion circuit converts between I/O signals compatible with the field device and a digital data format.

Fixed-mode conversion circuits convert between one type of I/O signal and the digital data format.

Selectable-mode conversion circuits selectively convert between different types of I/O signals and the digital data format. Selectable-mode conversion circuits allow different types of field devices to be connected to each set of terminals of the terminal block.

Brodbeck, et al. U.S. Pat. No. 9,971,727 "Universal I/O Signal Interposer System", assigned to the applicant and incorporated by reference herein, discloses removable I/O modules referred to as interposers insertable in the I/O channel to process the I/O signals, supply power to field devices, interpose fuses or other ancillaries in the signal path, and other functions.

FIG. 6 illustrates a field device I/O connector A for connecting a field device to a process control network N. The field device I/O connector is shown attached to the field wires of a field device D and transceives I/O signals to and from the field device. The field device I/O connector includes a base B having a set of terminals T and a removable I/O module M. The base defines a base I/O channel portion Cb. The I/O module includes a module I/O channel portion Cm. When the I/O module is plugged into the base, connector halves of an electrical connector S electrically connect the base I/O channel portion and the module I/O channel portion to form part of an I/O channel C. The I/O channel includes a conversion circuit V that converts between I/O signals compatible with the field device and a digital data format of the process control network. A network port P connects the field device I/O connector to the process control network and sends and receives digital data to and from the network.

It is desired to provide a field device I/O connector having a removable I/O module that can provide diagnostic information concerning operation or operating history of the I/O channel associated with the I/O module, the ancillary inserted in the I/O channel by the I/O module, or the field device attached to the I/O channel.

SUMMARY OF THE DISCLOSURE

Disclosed is a field device I/O connector having a removable I/O module that provides diagnostic information concerning operation or operating history of the I/O channel associated with the I/O module, the ancillary inserted in the I/O channel by the I/O module, or the field device attached to the I/O channel.

An embodiment of a field device I/O connector in accordance with this disclosure includes a base and a removable I/O module attached to the base for transmitting I/O signals along an I/O channel. The base includes a set of one or more electrical connectors that connect the base to the field wires of a field device. The set of electrical connectors can be formed in a possible embodiment as a set of one or more terminals that connect the base to the field wires of a field device. The set of electrical connectors can be adapted to conform to the number of field wires of the field device and the desired type of termination of the field wires.

The base defines a base I/O channel portion that includes the set of electrical connectors. The I/O module includes a module I/O channel portion. When the I/O module is attached to the base, the base and I/O module I/O channel portions are electrically connected together and define part of an I/O channel.

The I/O channel includes a conversion circuit. The conversion circuit may be a fixed-mode conversion circuit or a selectable-mode conversion circuit. Examples of selectable-mode conversion circuits that can be adapted for use with the disclosed I/O field device connection include, but are not limited to, those provided by the commercially available ANALOG DEVICES AD74412R or AD74413R signal processing integrated circuit (Analog Devices, Inc., One Technology Way, Norwood Mass. 02062-9106 USA). The conversion circuit is connected to a network port on the base that transmits digital data between the field device I/O connector and the process control network.

The I/O module enables signal processing of the I/O signal, supplying power to the field device, interposing fuses or other ancillaries in the signal path, and other functions as disclosed in the '727 patent. In other possible embodiments the I/O module can provide pre-commission connection to an attached field device for validating the field device installation during construction of the process control network.

When the I/O module is attached to the base, the I/O module and the base also cooperatively define a diagnostic circuit connected to the module I/O channel portion. The diagnostic circuit in embodiments provides diagnostic information concerning operation or operating history of the I/O channel associated with the I/O module, an ancillary inserted in the I/O channel by the I/O module, the field device attached to the I/O channel, or perform some other diagnostic function.

In possible embodiments, the base is configured with multiple sets of electrical connectors to connect to multiple field devices at one time. The multiple sets of electrical connectors in a possible embodiment are formed as a terminal block having multiple sets of terminals for landing field wires of the multiple field devices. Multiple respective base I/O channel portions extend from the sets of terminals of the terminal block. Each base I/O channel portion removably attaches an I/O module to the base to form part of an I/O channel.

In embodiments, the diagnostic circuit in the I/O module includes a diagnostic logic circuit that monitors the diagnostic circuit, performs the diagnostic logic to generate diagnostic data, and transmits the diagnostic data output to an output in the base. Having each I/O module have its own diagnostic logic circuit enables customization of the diagnostic logic circuit for the specific configuration of the I/O module or the type of field device the I/O module is intended to be connected to.

In other embodiments the diagnostic logic circuit is outside of the I/O module and may be located on the base or remote from the base.

The digital data output from the base in embodiments of the disclosed field device I/O connector includes both digitized I/O signal data from each field device attached to the field device I/O connector and diagnostic data generated from each I/O module attached to the base of the field device I/O connector.

Other objects and features of the disclosure will become apparent as the description proceeds, especially when taken in conjunction with the accompanying drawing sheets illustrating one or more non-limiting embodiments.

DETAILED DESCRIPTION

Figure 1:
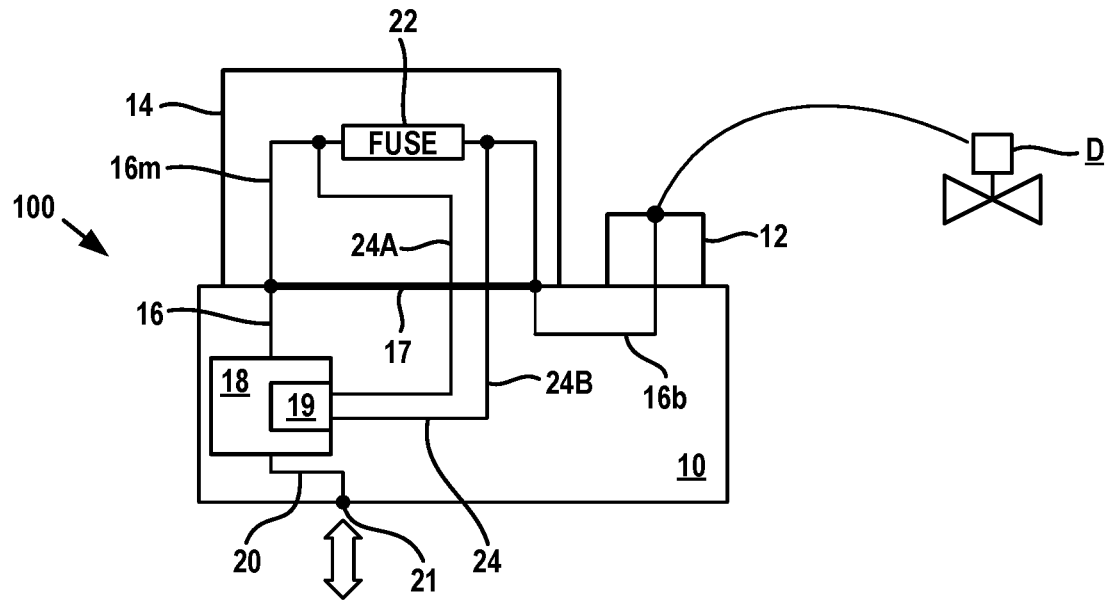
FIG. 1 is a schematic side view of a first embodiment single-field device I/O connector in accordance with this disclosure.

FIG. 1 illustrates a first embodiment single-field device I/O connector 100. The field device I/O connector includes a base 10 having a set of electrical connectors that land the field wires of a field device D. The set of electrical connectors is formed as a terminal block that includes a set of terminals 12. The terminal block can be configured as needed for the number of field wires from the field device and the type of termination desired for the field wires.

Removably mounted on the base 10 is an I/O module 14. The terminals of the terminal block 12 and the base define a base I/O channel portion 16b. The I/O module includes a module I/O channel portion 16m.

When the I/O module is mounted to the base, the base I/O channel portion and the module I/O channel portion are electrically connected together by a pair 17 of male and female cooperating electrical connectors (one electrical connector fixedly attached to the I/O module, the other electrical connector fixedly attached to the base). The pair 17 of electrical connectors electrically connect the base and module I/O channel portions together to cooperatively define an I/O channel 16.

The I/O channel includes a conversion circuit described in more detail below. The illustrated I/O channel 16 is part of a signal processing circuit 18 disposed in the base that includes the conversion circuit. In other possible embodiments the I/O channel 16 extends away from the base to a conversion circuit not disposed on the base.

A digital data circuit 20 extends from the signal processing circuit 18 to a network port 21. The digital data circuit and the network port cooperate to transfer digital data from the signal processing circuit out of the field device I/O connector to the process control network and to transfer digital data received from the process control network to the signal processing circuit. The network port is compatible with the physical layer of the process control network and in embodiments may be a jack (for example, an RJ45 jack), a set of terminals, a communications bus, a cable socket, part of a backplane, or the like.

If the conversion circuit is a selectable-mode conversion circuit, the data transferred to the signal processing circuit can include commands to set the operating mode of the conversion circuit as required by the type of field device D.

The illustrated I/O module 14 inserts an ancillary formed as a fuse 22 in the signal path of the I/O channel 16. The I/O module 14 also includes a portion 24A of a diagnostic circuit that is connected to the I/O channel across the fuse. The diagnostic circuit monitors the state of the fuse (fuse open, fuse closed, or the like).

When the I/O module 14 is plugged into the base 10, the module diagnostic circuit portion 24A connects with a base diagnostic circuit portion 24B carried in the base through the pair 17 of cooperating male and female electrical connectors to define a diagnostic circuit 24 operable to monitor the state of the fuse. The diagnostic circuit 24 does not affect the signal traveling through the I/O channel 16 (much like a voltmeter does not significantly affect the voltage drop of a circuit or an ammeter does not significantly affect current flow through a circuit).

In the illustrated embodiment the diagnostic circuit 24 is connected to a diagnostic logic circuit 19 forming part of the signal processing circuit 18. The diagnostic logic circuit extracts diagnostic data from the diagnostic circuit and formats the diagnostic data in a digital data format. The diagnostic data is output from the field device I/O connector through the network port 21.

Figure 6:
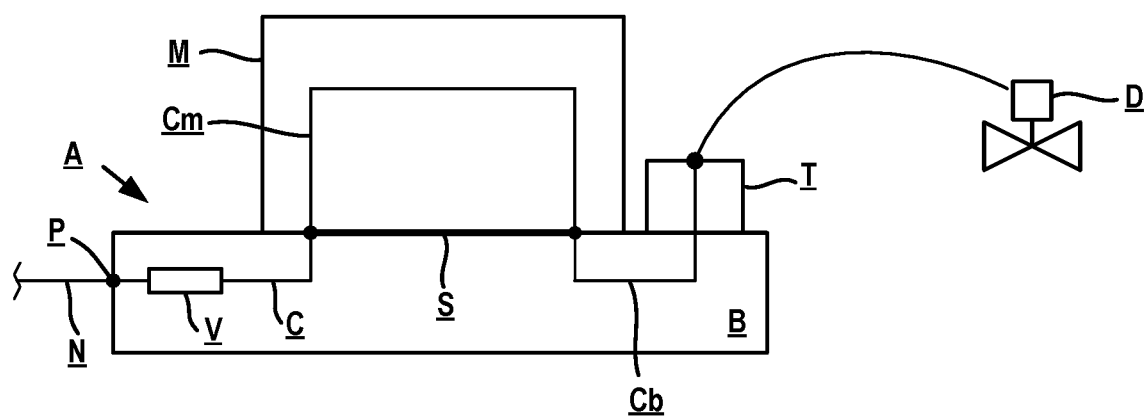
FIG. 6 is a schematic side view of a field device I/O connector of the type disclosed in the '727 patent.

An I/O module like the I/O module M shown in FIG. 6 that lacks a diagnostic circuit can perform properly when connected to the base 10 but would not provide diagnostic data.

Figure 2:
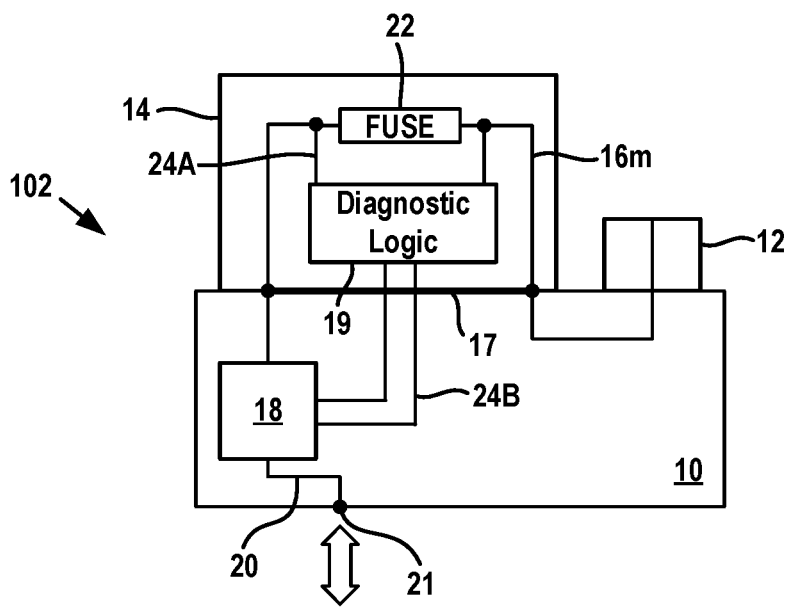
FIG. 2 is similar to FIG. 1 but of a second embodiment single-field device I/O connector in accordance with this disclosure.

FIG. 2 illustrates a second embodiment single-field device I/O connector 102 similar to the field device I/O connector 100. In this embodiment the diagnostic logic circuit 19 is carried in the I/O module 14. The module diagnostic circuit portion 24A includes a portion extending from the module I/O channel portion 16m to the diagnostic logic circuit 19, and a portion extending from the diagnostic logic circuit for transmitting the diagnostic data extracted by the diagnostic logic circuit out of the I/O module. The base diagnostic circuit portion 24B is configured to receive the diagnostic data from the I/O module and transmit the diagnostic data to the signal processing circuit 18 for output through the network port 21.

In both of the embodiments shown in FIGS. 1 and 2, the control system can communicate with the diagnostic logic circuit 19 through the network port 21 if the signal processing circuit and diagnostic logic circuit are configured for two-way communication represented by the double arrow shown in FIG. 1 and in FIG. 2. This enables the control system to change acceptable parameters, reset accumulated values, or otherwise set or modify values stored or used by the diagnostic logic circuit.

Figure 3:
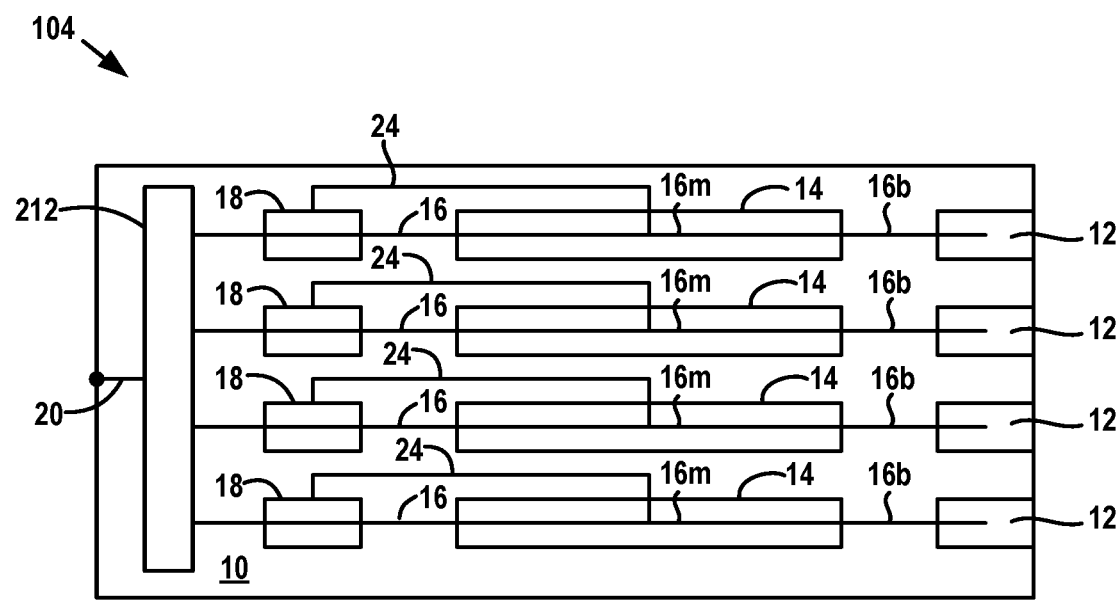
FIG. 3 is a schematic diagram of a multi-field device I/O connector in accordance with this disclosure.

FIG. 3 illustrates a multi-field device I/O connector 104 configured to attach the field wires of up to four field devices (not shown) to the connector. Other embodiments of a multi-field device I/O connector may be configured to attach up to two, three, or more than four field devices.

The base 10 includes multiple sets of electrical connectors formed as a terminal block having four sets of terminals 12 configured to connect the field wires of the field devices to the multi-field I/O connector. The base and the sets of terminals define four like base I/O channel portions 16b. The multi-field device I/O connector carries up to four removable I/O modules 14 of the kind described above, each I/O module including a module I/O channel portion 16m. The base and the I/O modules form respective I/O channels 16 that each include a signal processing circuit 18 as previously described with respect to the I/O channel of the single-field device I/O connector.

The four signal processing circuits 18 are connected to a common communication circuit 212 that handles data transmission between the digital data circuit 20 and the signal processing circuits. Each I/O channel is associated with a respective diagnostic circuit 24 that monitors the module I/O channel portion as previously described for the single-field device I/O connector. Each diagnostic circuit may include a diagnostic logic circuit formed as part of the signal processing circuit of the I/O channel or in the I/O module as previously described.

In FIG. 3 each diagnostic circuit 24 is connected to the signal processing circuit 18 associated with its I/O module. In other embodiments with diagnostic logic circuits disposed in the I/O modules, a diagnostic data output circuit similar to the diagnostic data output circuit 26 shown in FIG. 2 is associated with each I/O module and connects the logic diagnostic circuit in the I/O module with the signal processing circuit.

Figure 4:
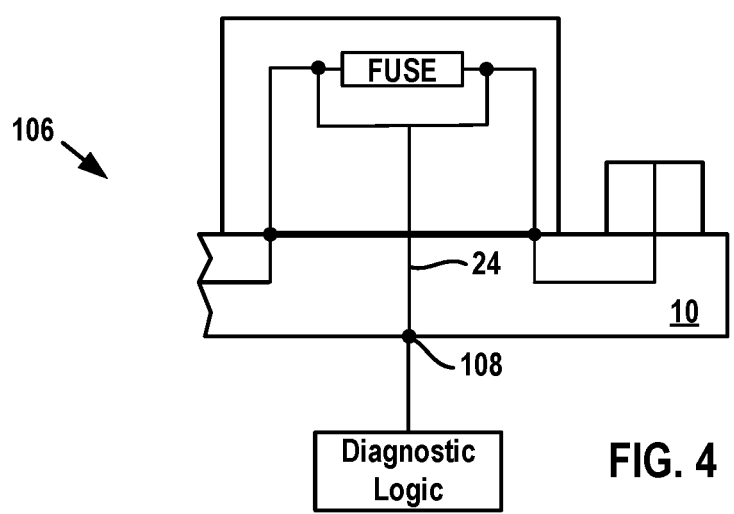
FIG. 4 is a schematic top view of a portion of a fourth embodiment field device I/O connector in accordance with this disclosure.

Yet another possible embodiment of a field device I/O connector 106 is shown in FIG. 4 and is similar to the field device I/O connector 102 shown in FIG. 2. In this embodiment, however, the diagnostic circuit 24 connects to its own separate, dedicated output port 108 of the field device I/O connector. The output port in embodiments may be realized as a jack, communications bus, cable socket, or the like and is intended to connect the diagnostic circuit to a diagnostic logic circuit remote from the field device I/O connector.

Figure 5:
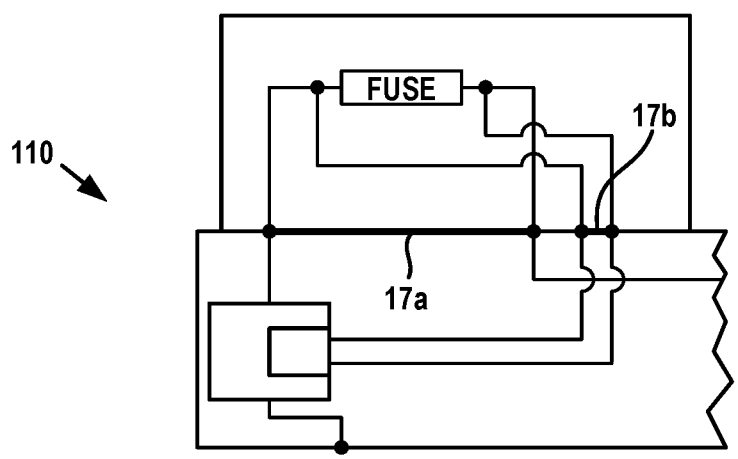
FIG. 5 is a schematic side view of a portion of a fifth embodiment field device I/O connector in accordance with this disclosure.

In FIGS. 1-4, a pair of cooperating electrical connectors electrically connect the base 10 and an I/O module 14. FIG. 5 illustrates a portion of a field device I/O connector 110 similar to the field device I/O connector 100 but has the I/O channel circuit portions connected by a first pair 17a of male and female electrical connectors and the diagnostic circuit portions connected by a second pair 17b of male and female electrical connectors. I/O modules without a diagnostic circuit can include a dummy male or female electrical connector to form the pair 17b of electrical connectors.

Some of the circuits shown in the drawings are drawn as single lines to simplify the drawings and can represent multiple-wire or multiple-line circuit paths as understood in the art.

Other examples of electrical connectors that can be used to land wires of a field device in embodiments of single-field device I/O connectors or multi-field device I/O connectors in accordance with this disclosure include, but are not limited to, pluggable wire connectors in which the wires terminate on the electrical connectors, fixed terminals in which the wires enter terminals fixed directly on the base, electrical connectors that are removably mounted on the base to enable mechanical and/or electrical disconnection of the electrical connectors from the base without disturbing field wire attachments to the electrical connectors, male or female electrical connectors that mate with corresponding female or male electrical connectors attached to and forming part of individual field wires, cable connectors for connecting a cable containing the field wires extending from the field device, and the like.

While one or more embodiments are disclosed and described, it is understood that this is capable of modification and that the scope of the disclosure is not limited to the precise details set forth but includes modifications obvious to a person of ordinary skill in possession of this disclosure, including (but not limited to) changes in material selection, diagnostic functions, types or numbers of electrical connectors for connecting field devices (for non-limiting examples, terminals or a cable connectors), and also such other changes and alterations as fall within the purview of the disclosure and the following claims.

What is claimed is:

1. A field device I/O connector for connecting a field device to a process control network, the field device I/O connector comprising:
   a base and an I/O module removably attached to the base;
   an electrical connector mounted on the base, the electrical connector being connectable with field wires extending from the field device to carry I/O signals between the field device I/O connector and the field device;
   the electrical connector and the base defining a base I/O channel portion extending from the electrical connector, the base I/O channel portion comprising a first base I/O channel subportion extending from the electrical connector and a second base I/O channel subportion;
   the I/O module comprising a module I/O channel portion, the module I/O channel portion being disposed between and electrically connecting the first base I/O channel subportion and the second base I/O subportion, the base I/O channel portion and the module I/O channel portion together forming an I/O channel when the I/O module is attached to the base, the base I/O channel portion comprising a conversion circuit being disposed at an end of the second base I/O subportion and being configured to convert between I/O signals and a digital data format used by the process control network;
   the base comprising a digital data circuit and a network port, the digital data circuit connected to the conversion circuit and being configured to transfer digital data received from the conversion circuit to the network port and to transfer digital data received from the network port to the conversion circuit, the network port being configured to be attachable to the process control network and transmit data received from the digital data circuit to the process control network and to transmit digital data received from the process control network to the digital data circuit when the network port is attached to the process control network;
   the base and the I/O module cooperatively defining a diagnostic circuit portion electrically connected to the module I/O channel portion when the I/O module is attached to the base, the diagnostic circuit portion extending from the module I/O channel and into the base when the I/O module is attached to the base, the diagnostic circuit portion being configured to transmit diagnostic data concerning the operating state or operational history of the I/O channel, I/O channel circuit components, or the field device attached to the I/O channel when the field device I/O connector is connecting the field device to the process control network and the base comprising a diagnostic logic circuit, the diagnostic circuit portion extending from the I/O module to the diagnostic logic circuit when the I/O module is attached to the base, the diagnostic logic circuit being configured to extract diagnostic data from the diagnostic circuit portion and output the diagnostic data in a digital data format.

2. The field device I/O connector of claim 1 wherein the digital data circuit is connected to the diagnostic logic circuit and is configured to transfer diagnostic data output from the diagnostic logic circuit to the network port.

3. The field device I/O connector of claim 1 wherein in operation the digital logic circuit extracts diagnostic data from the diagnostic circuit portion and outputs the diagnostic data in a digital data format.

4. The field device I/O connector of claim 3 wherein a signal processing circuit includes the conversion circuit and the diagnostic logic circuit, the signal processing circuit being configured to transmit digital data from the conversion circuit and diagnostic data from the diagnostic logic circuit to the digital data circuit.

5. The field device I/O connector of claim 1 wherein the diagnostic circuit portion extends to a dedicated output port disposed in the base separate from the network port to transmit diagnostic data away from the base.

6. The field device I/O connector of claim 5 wherein the diagnostic circuit portion does not include a diagnostic logic circuit.

7. The field device I/O connector of claim 1 wherein the digital data circuit is configured to receive data from the network port in a digital format and transmit the received data to the conversion circuit for conversion into I/O signals.

8. The field device I/O connector of claim 1 wherein the I/O module interposes an ancillary in the I/O channel and the diagnostic circuit portion is configured to monitor the state or operation of the ancillary.

9. The field device I/O connector of claim 8 wherein the ancillary is one of the following: a fuse, a relay, and a manually operated disconnect.

10. The field device I/O connector of claim 1 being a multi-field device I/O connector wherein the electrical connector is a first electrical connector of a plurality of electrical connectors on the base, the base I/O channel portion is a first base I/O channel portion of a plurality of like base I/O channel portions, each first base I/O channel subportion extending from a respective electrical connector, the I/O module is a first I/O module of a plurality of I/O modules attached to the base, each base I/O channel portion of the plurality of base I/O channel portions cooperates with a respective module I/O channel portion of the plurality of I/O modules in defining a respective module I/O channel and a respective diagnostic circuit portion connected to the module I/O channel portion, the respective diagnostic portion extending from the module I/O channel portion to a respective diagnostic logic circuit of the plurality of diagnostic logic circuits.

11. A base for a field device I/O connector, the base being configured to removably mount an I/O module for processing or transmitting I/O signals received from or sent to a field device of a process control network, the I/O module of the type having a channel portion that conducts an I/O signal and a diagnostic circuit portion connected to the signal channel portion for generating diagnostic data using the signal channel portion, the base comprising:

a first electrical connector, a second electrical connector, a base I/O channel portion electrically connecting the first and second electrical connectors and a base diagnostic circuit portion electrically connected to the second electrical connector;

the first electrical connector being connectable with field wires extending from the field device to carry I/O signals between the base and the field device;

the second electrical connector being configured to removably attach the I/O module to the base and thereby electrically connect the module I/O channel portion with the base I/O channel portion and electrically connect the base diagnostic circuit portion with the I/O module diagnostic circuit portion when the I/O module is attached to the base, the base I/O channel portion and the I/O module channel portion when electrically connected with one another cooperatively forming an I/O channel, the I/O module diagnostic circuit portion and the base diagnostic circuit portion when electrically connected with one another cooperatively forming a diagnostic circuit portion;

the base I/O channel portion further comprising a conversion circuit being configured to convert between I/O signals received from the I/O module and a digital data format used by the process control network and to convert from the digital data format used by the process control network to I/O signals transmitted to the I/O module;

the base further comprising a digital data circuit and a network port, the digital data circuit connected to the conversion circuit and being configured to transfer digital data between the network port and the conversion circuit, the network port being configured to be attachable to the process control network and transmit data between the digital data circuit and the process control network when the network port is attached to the process control network;

the diagnostic circuit portion formed when the I/O module is attached to the base being configured to transmit diagnostic data concerning the operating state or operational history of the I/O channel, I/O channel circuit components, or the field device attached to the I/O channel; and the base comprising a diagnostic logic circuit, the base diagnostic circuit portion extends to the diagnostic logic circuit, the diagnostic logic circuit being configured to extract diagnostic data from the diagnostic circuit portion and able to transmit the diagnostic data through the network port.

12. The base of claim 11 further comprising a signal processing circuit that includes the conversion circuit and the diagnostic logic circuit, the signal processing circuit being configured to transmit digital data from the conversion circuit and diagnostic data received from the diagnostic logic circuit to the digital data circuit.

13. The base of claim 11 wherein the diagnostic logic circuit transmits diagnostic data extracted from the diagnostic logic circuit to the network port for output to the process control network.

14. The base of claim 11 wherein the base comprises a dedicated output port separate from the network port, and the base diagnostic circuit portion extends to the output port.

15. The base of claim 11 wherein the I/O module is the type that interposes an ancillary in the I/O channel and the diagnostic circuit portion is configured to monitor the state or operation of the ancillary when the I/O module is attached to the base.

16. The base of claim 11 wherein the base I/O channel portion is a first base I/O channel portion of a plurality of base I/O channel portions, the base diagnostic circuit portion is a first base diagnostic circuit portion of a plurality of base diagnostic circuit portions, the diagnostic logic circuit is a first diagnostic logic circuit of a plurality of diagnostic logic circuits of the base, each base diagnostic circuit portion of the plurality of base diagnostic circuit portions extending to a respective diagnostic logic circuit of the plurality of diagnostic logic circuits, the first electrical connector is a first electrical connector of a plurality of first electrical connectors, and the second electrical connector is a first second electrical connector of a plurality of second electrical connectors whereby the field device I/O connector is capable of connecting to, diagnosing, and communicating with a plurality of field devices.

\* \* \* \* \*